United States Patent [19]

Janai et al.

[11] Patent Number: 5,619,062

[45] Date of Patent: *Apr. 8, 1997

[54] PERSONALIZABLE GATE ARRAY DEVICES

[75] Inventors: Meir I. Janai, Haifa, Israel; Zvi Orbach, Sunnyvale, Calif.

[73] Assignee: Chip Express (Israel) Ltd., Haifa, Israel

[*] Notice: The term of this patent shall not extend beyond the expiration date of Pat. No. 5,545,904.

[21] Appl. No.: 404,042

[22] Filed: Mar. 14, 1995

Related U.S. Application Data

[63] Continuation of Ser. No. 81,553, Jun. 23, 1993, Pat. No. 5,545,904, which is a continuation of Ser. No. 626,199, Dec. 7, 1990, abandoned, which is a continuation-in-part of Ser. No. 344,582, Apr. 28, 1989, Pat. No. 5,049,969, which is a continuation-in-part of Ser. No. 222,514, Jul. 21, 1988, Pat. No. 4,933,738, said Ser. No. 81,553, is a continuation-in-part of Ser. No. 449,063, Dec. 18, 1989, Pat. No. 4,924,287, which is a continuation of Ser. No. 311,397, Feb. 16, 1989, abandoned, which is a continuation of Ser. No. 273,706, Nov. 15, 1988, abandoned, which is a continuation of Ser. No. 819,707, Jan. 17, 1986, abandoned.

[30] Foreign Application Priority Data

Jan. 20, 1985 [IL] Israel .......................................... 74108
Apr. 25, 1988 [IL] Israel .......................................... 86162

[51] Int. Cl.[6] .......................... H01L 27/02; H01L 27/10; H01L 27/15
[52] U.S. Cl. .......................... 257/529; 257/202; 257/204; 257/209
[58] Field of Search .................................. 257/529, 209, 257/202, 204

[56] References Cited

U.S. PATENT DOCUMENTS

| 3,925,684 | 12/1975 | Gaskill | 307/203 |
|---|---|---|---|
| 4,045,310 | 8/1977 | Jones et al. | 257/529 |
| 4,124,899 | 11/1978 | Birkner . | |
| 4,197,555 | 4/1980 | Uehara . | |
| 4,233,671 | 11/1980 | Gerzberg . | |
| 4,238,839 | 12/1980 | Redfern . | |
| 4,240,094 | 12/1980 | Mader . | |
| 4,295,149 | 10/1981 | Balyoz . | |

(List continued on next page.)

FOREIGN PATENT DOCUMENTS

| 0112693 | 7/1984 | European Pat. Off. . |
|---|---|---|
| 0210397 | 6/1986 | European Pat. Off. . |
| 0303396 | 2/1989 | European Pat. Off. . |
| 0336026 | 10/1989 | European Pat. Off. . |
| 0245014 | 11/1989 | European Pat. Off. . |
| 61678 | 12/1980 | Israel . |
| 53-78789 | 7/1978 | Japan . |
| 60-16438 | 1/1985 | Japan . |
| 1133992 | 5/1987 | United Kingdom . |

OTHER PUBLICATIONS

N.H.E. Weste et al. "Principles of CMOS VLSI Design, A System Perspective", Addison–Wesley (Jun. 1988) pp. 241–4, 370, 374.

North, J. et al. "Laser Coding . . . " IEEE Int'l. of Solid State Devices, vol. SC–II, No. 4.

Aug. 1976, pp. 500–505.

(List continued on next page.)

Primary Examiner—J. J. Carroll
Attorney, Agent, or Firm—Ladas & Parry

[57] ABSTRACT

Customizable semiconductor devices, integrated circuit gate arrays and techniques to produce same are disclosed. The devices comprise integrated circuit blanks having a collection of semiconductor elements and at least one metal layer including fusible links interconnecting said collection of semiconductor elements into an inoperably connected integrated circuit blank. At least one metal layer is first etched thereby to define a pattern of conductors. A passivation layer is provided over at least one metal layer, afterwhich at least one metal layer is etched a second time for selectably removing the fusible links, thereby converting the inoperable integrated circuit blank into a selected operable electronic function.

2 Claims, 15 Drawing Sheets

U.S. PATENT DOCUMENTS

| | | | |
|---|---|---|---|
| 4,325,169 | 4/1982 | Ponder | 257/369 |
| 4,356,504 | 10/1982 | Tozun . | |
| 4,412,237 | 10/1983 | Matsumura . | |
| 4,455,495 | 6/1984 | Masuhara . | |
| 4,476,478 | 10/1984 | Noguchi . | |
| 4,536,949 | 8/1985 | Takayama . | |
| 4,590,589 | 5/1986 | Gerzberg . | |
| 4,651,190 | 3/1987 | Suzuki . | |
| 4,674,452 | 6/1987 | Zommer . | |
| 4,700,214 | 10/1987 | Johnson . | |
| 4,758,745 | 7/1988 | Elgamal . | |
| 4,795,720 | 1/1989 | Kawanabe . | |
| 4,924,287 | 5/1990 | Orbach . | |

OTHER PUBLICATIONS

Schuster, S. "Selective Metallization . . . " IBM Tech Disc. Bull. vol. 15, No. 2, Jul. 1972, p. 551.

Raffel, J.I. et al. "A Wafer Scale . . . " IEEE, Journal of Solid State Circuits, vol. SC–20., No. 1., Feb. 1985.

Disclosed Figures BAS–1, BAZ, and BA–3 of US Pat. 5049969.

C.J. Boisvert, "One Day Prototype Laser . . . ", 8079 Electro 186 α Mini/Micro Northeast, 11 (1986) Conference Record, Los Angeles CA U.S. p.

R.M. Fisher, "Nonvolatile Memories" IEEE International Solid State Circuits Conference, vol. 25, Feb. 1982, NY. USA pp. 114–115.

Ono, K "A Method for Producing a Semiconductor Integrated Circuit", Kokai JP 53–78789 Japan (English Translation).

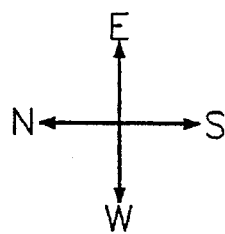
FIG.10B
PRIOR ART
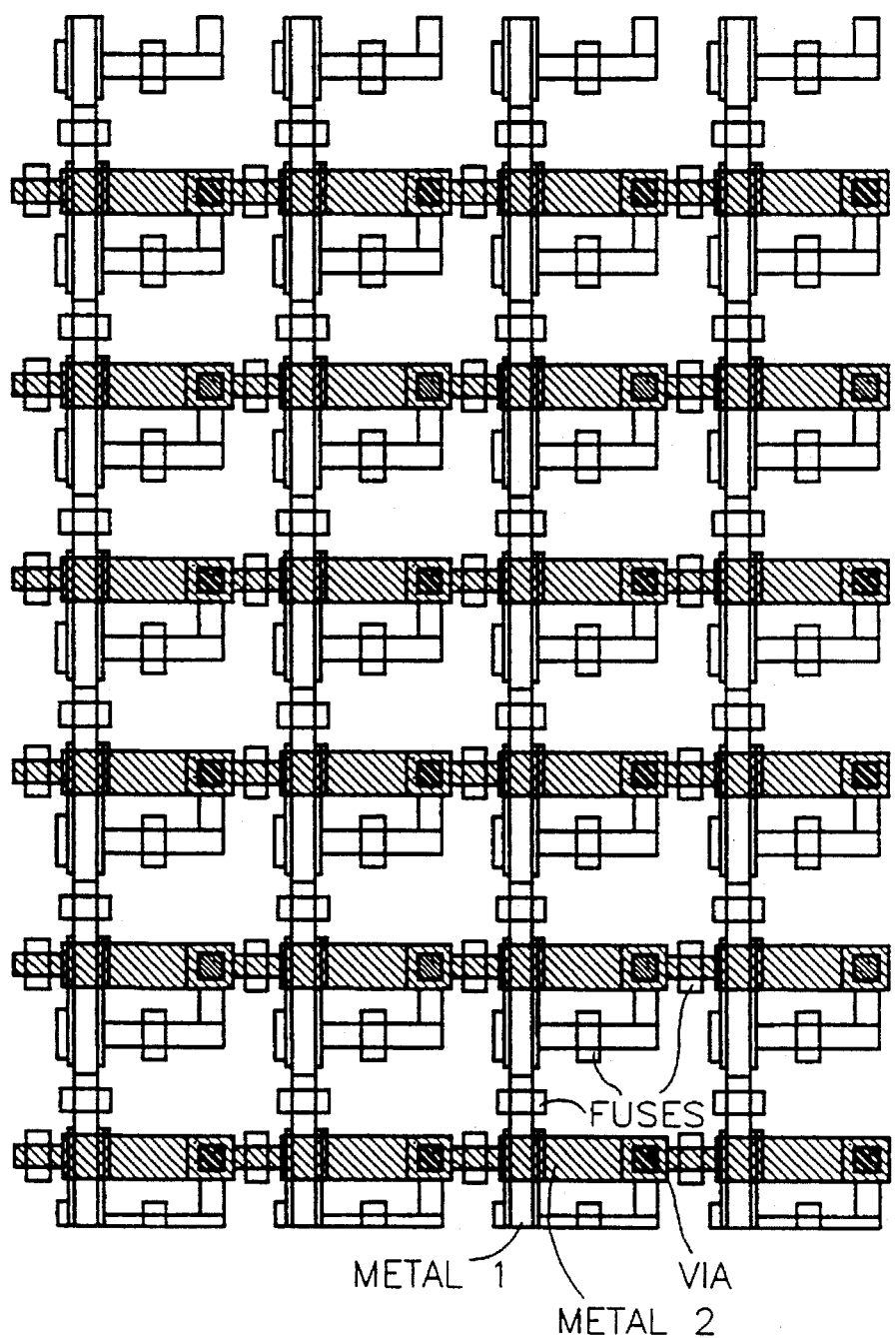

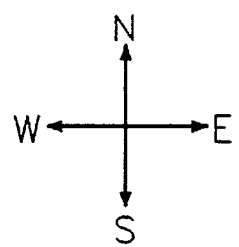
FIG.10C
PRIOR ART
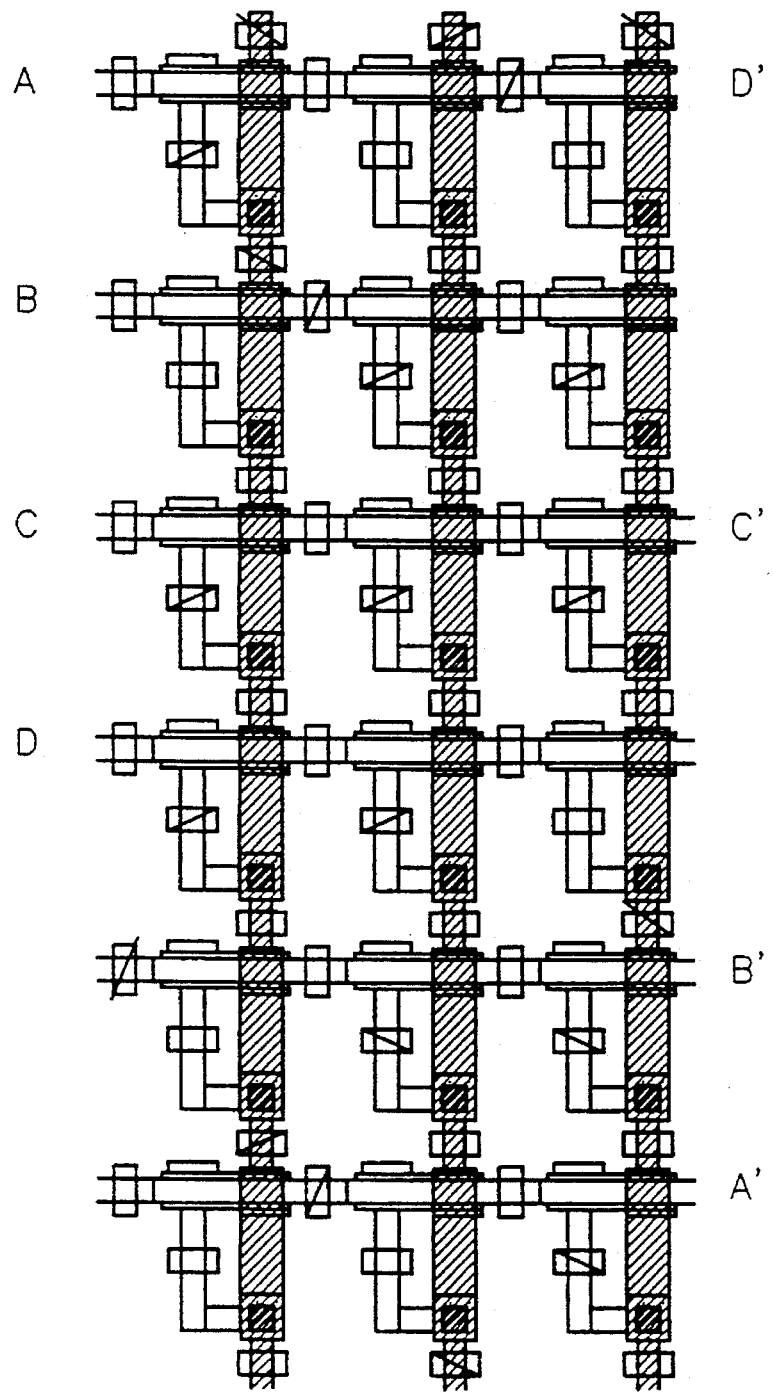

PERSONALIZABLE GATE ARRAY DEVICES

RELATED APPLICATIONS

This application is a continuation of U.S. patent application Ser. No. 08/081,553, filed Jun. 23, 1993, U.S. Pat. No. 5,545,904, which is a continuation of U.S. patent application Ser. No. 07/626,199 filed Dec. 7, 1990, abandoned, which is a continuation-in-part of U.S. Ser. No. 07/344,582, filed Apr. 28, 1989, issued as U.S. Pat. No. 5,049,969, which is a continuation-in-part of U.S. patent application Ser. No. 07/222,514, filed Jul. 21, 1988, issued as U.S. Pat. No. 4,933,738. Application Ser. No. 08/081,553 filed Jun. 23, 1993, U.S. Pat. No. 5,545,904, is also a continuation-in-part of U.S. patent application Ser. No. 07/449,063, filed Dec. 18, 1989, issued as U.S. Pat. No. 4,924,287, which is a continuation of U.S. patent application Ser. No. 07/311,397, filed Feb. 16, 1989, abandoned, which is a continuation of U.S. patent application Ser. No. 07/273,706, filed Nov. 15, 1988, abandoned, which is a continuation of U.S. patent application Ser. No. 06/819,707, filed Jan. 17, 1986, abandoned.

FIELD OF THE INVENTION

The present invention relates to semiconductor devices generally and more particularly to customizable semiconductor devices and to a technique for fabricating same.

BACKGROUND OF THE INVENTION

Integrated circuits are electronic circuits which normally include a very large number of semiconductor elements, such as transistors and diodes, as well as other electronic components, in highly compact form on a silicon wafer. The basic principle underlying integrated circuits is that instead of building an electronic circuit out of discrete components such as transistors, diodes, resistors and capacitors, the entire circuit is fabricated on the same piece of silicon in the form of a number of superimposed layers of conducting, insulating and transistor forming materials. By arranging predetermined geometric shapes in each of these layers, a circuit having a required function is realized.

The process by which an integrated circuit is fabricated is long and complex and basically includes the following steps:

1. A polished silicon wafer is exposed to an appropriate material in a high temperature furnace in order to "grow" a uniform layer of the material on its surface.

2. After the wafer is cooled, it is coated with a thin film of resist material, which is dried and baked.

3. At the same time, a mask for the appropriate layer is created, which defines the precise pattern required on the silicon surface.

4. This mask is brought firmly into proximity with the coated wafer and exposed to intense ionizing radiation such as ultraviolet light or low-energy x-rays. In areas wherein the mask is transparent to such radiation, the ionizing radiation passes into the resist and breaks down its molecular structure. The portions of the resist that are covered by opaque portions of the mask are not affected.

5. The resist is then developed by immersing the silicon wafer in a solvent which dissolves the resist only at the locations which were exposed to the ionizing radiation.

6. The wafer is then exposed to an appropriate etching material which is effective to remove the material grown previously thereon (Step 1), except where the material is covered by resist, thus defining a desired pattern of the grown material.

7. The remaining resist material is then removed.

The above process is repeated for each of the layers of material forming the integrated circuit. In most integrated circuit technology one or more layers of metal are employed for internal connections on the integrated circuit. These metal layers are usually formed last.

As can be readily appreciated, the above process requires sophisticated machinery and custom masks which must be specially set up for each specific type of custom integrated circuit to be fabricated. For the process to be at all economical, extremely large quantities of integrated circuits must be produced for a given set up. Since there exist applications wherein the quantities desired of a specific circuit are not extremely large, techniques have been developed for producing integrated circuits known as gate arrays. In these gate arrays, a large amount of transistors and other components are produced by the above-described mass production techniques. Specific interconnections therebetween suitable for a specific circuit are then formed on the chip by etching a suitable metal layer thereon. There exist advanced gate-arrays wherein two or more layers of custom metal interconnections may be custom etched.

Despite the use of sophisticated computer aided design and semi-custom devices, the widespread use of dedicated non-standard integrated circuits is still limited because of the high costs and long lead time involved in their fabrication. Many users of integrated circuits still make extensive use of standard, "off the shelf" available small scale and medium scale integrated circuits.

Electronic circuits manufactured by combining a large number of such standard integrated circuits have a number of disadvantages:

a. A large number of printed circuit boards are required, resulting in an expensive product, relatively long assembly time, relative difficulty in maintenance and troubleshooting and large size.

b. Lower electrical power efficiency is realized. As a result, relatively larger power sources are required and heavier and larger products result.

There are known integrated circuits such as EPROMS and PALS (programmable array logic) which are programmed by fusing which is accomplished electrically via the integrated circuit's input/output pins, requiring elaborate extra fusing circuitry for this purpose.

There are also known techniques for increasing yield of integrated circuits by excising inoperative portions thereof by fusing. This is normally done on wafers including a multiplicity of integrated circuits.

It is also known to produce gate arrays which are laser programmable. Such devices are described in a publication of Laserpath, Inc. of Sunnyvale, Calif. 94086 U.S.A. entitled "One Day Prototype Laser Programmed Arrays" dated Feb. 26, 1986.

Dual metal layer integrated circuit technology has been developed in recent years to enable automatic computer software controlled generation of integrated circuit layouts, commonly known as routing. In the early years of integrated circuit development, routing was done by hand. Due to the increased complexity and density of contemporary integrated circuits, manual routing is no longer possible.

Dual metal layer technology provides two independent routing layers extending in respective perpendicular directions, commonly termed North-South and East-West.

Changes in direction are provided by vias which interconnect the two layers, the vias typically being defined by an opening in the insulating layer between the two metal layers, being filled by metal from one of the two layers. A simple dual metal layout wherein vias are positioned at the locations of the desired direction changes is shown in FIG. 10A, wherein the horizontal strips are typically a metal I layer, indicated as M1, the vertical strips are typically a metal II layer, indicated as M2, and the vias interconnecting the two layers are labeled. The metal II layer overlies the metal I layer.

In order to permit rapid customization of dual metal type integrated circuits, it is desired that such customization be solely produced by fuse disconnection rather than by applying metal across a gap. Accordingly, configurations such as that shown in FIG. 10B were developed to combine the advantages of automatic routing with those of rapid customization, such that customization can be carried out by an automatic routing technique. In the configuration of FIG. 10B the North-South strips are indicated to be metal II while the East-West strips are indicated to be metal I and a via connecting the metal I and metal II layers is disposed adjacent each crossing of the respective metal I and metal II strips. The via underlies the metal II strip and is joined to the metal I strip by means of a branch having a fuse formed thereon. Fuses are also provided along the metal II strips between adjacent vias and along the metal I strips between adjacent branches.

Customization of the blank shown in FIG. 10B takes place by traveling along the metal I strips and fusing all fuses on the branches which are not used. If a direction change is desired, a branch is used to establish a connection to the metal II layer. When traveling along the metal II strips, if the desired direction of the strip is, for example, West, the fuses lying to the East are fused or vice versa. FIG. 10C illustrates the equivalent circuit to that shown in FIG. 10A embodied in the structure of FIG. 10B, where /'s over the fuse indicate fused fuses.

U.S. Pat. No. 4,197,555 to Uehara describes a structure in which a relatively long strip of M1 is used. Although this structure is adequate for PAL configuration applications, it is relatively unsuitable for gate array applications, particularly if an automatic place-and-route program is used. Also, the length of the M1 strip acts to increase the line capacitance.

SUMMARY OF THE INVENTION

The present invention seeks to provide selectably customizable semiconductor devices of the types described above which are suitable for prototype and small scale production and which are compact and thus compatible with high-density architecture, and is useful inter alia in gate array technology and particularly in CMOS gate array technology.

The present invention also seeks to provide a technique for production of the selectably customizable integrated circuits from finished integrated circuit blanks whereby it is possible to selectively remove portions of the metal conductor at a plurality of metal layers in the finished integrated circuit blank using a single mask.

BRIEF DESCRIPTION OF THE DRAWINGS

The present invention will be understood and appreciated more fully from the following detailed description taken in conjunction with the drawings in which:

FIGS. 10A–10C are illustrations of prior art layouts.

DETAILED DESCRIPTION OF PREFERRED EMBODIMENTS

The invention is applicable to a portion of a typical CMOS gate array circuit of the type illustrated in FIG. 1A of U.S. Pat. No. 4,924,287. The CMOS gate array is used as an example for the purposes of illustration herein. The invention is equally applicable to other types of gate arrays such as, for example, ECL and TTL and to the various designs of gate arrays of these types and others made by various manufacturers. The invention is also applicable to integrated circuits in general other than gate arrays.

The typical CMOS gate array circuit includes an array of semiconductor elements which may be interconnected by at least one and typically two suitable metal layers to define the electrical function of the circuit. According to the present invention, fusible links are provided between the semiconductor elements in a manner which enables the functions to be selected by the user.

Figure 1:
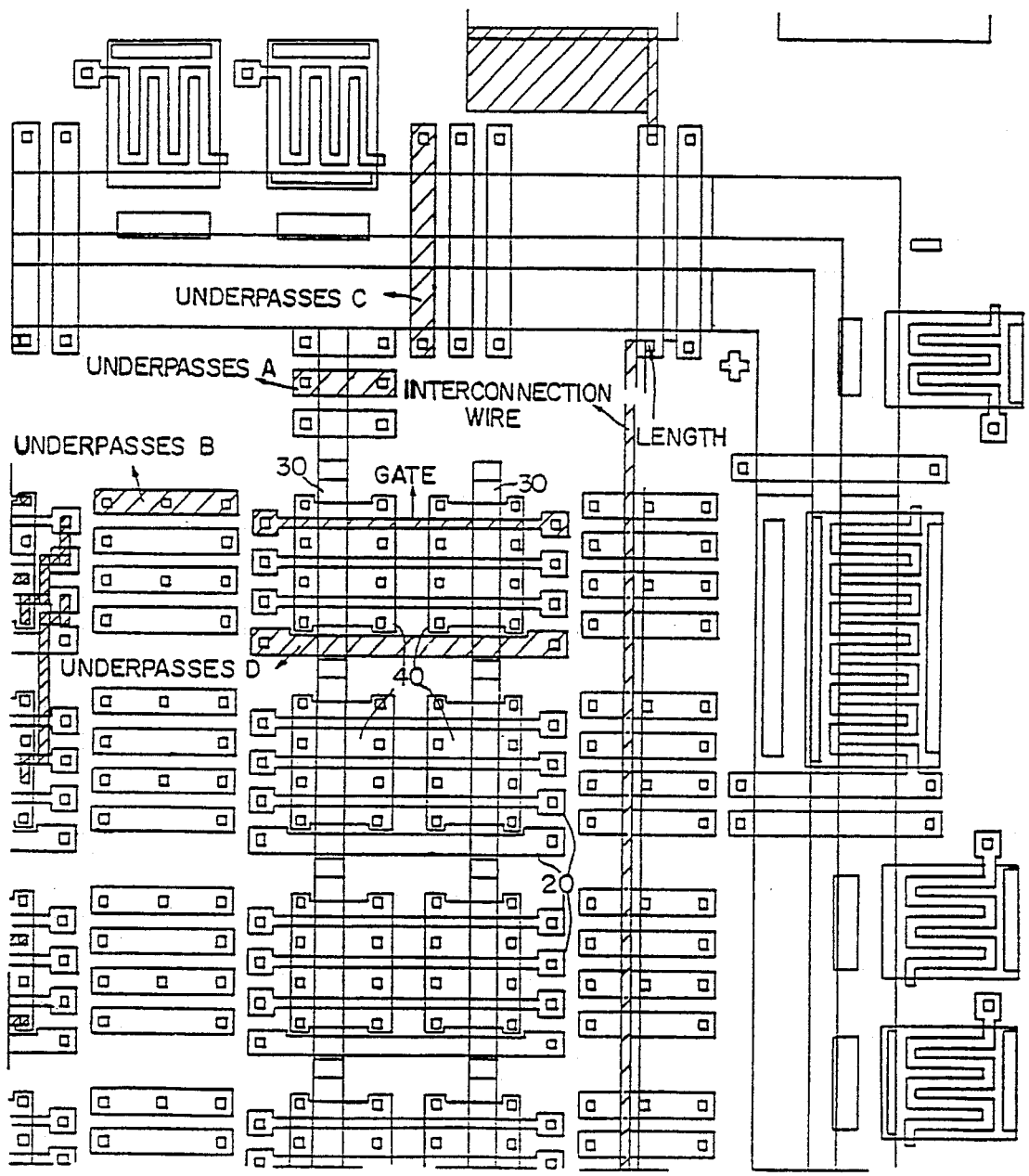
FIG. 1 is a general illustration of one type of an integrated circuit of conventional design to which the invention may be applied.

The basic structure of FIG. 1 is as follows: A first plurality of gates 20 arranged on the integrated circuit is separated from a second plurality of power lines 30, arranged as part of the at least one metal layer of the integrated circuit by sections 40 of layered semi-conductor material such as doped silicon. The interconnections between the various conductors define the electronic function provided by the integrated circuit.

More specifically each junction across the semi-conductor material defines a semiconductor element in its most basic form. A combination of these junctions may define a cell and a plurality of such combinations may define an electronic function equivalent to a plurality of cells.

The illustration of FIG. 1 does not illustrate the interconnections between the semiconductor elements. Those interconnections are provided in accordance with the present invention, as illustrated in FIG. 2.

Figure 2:
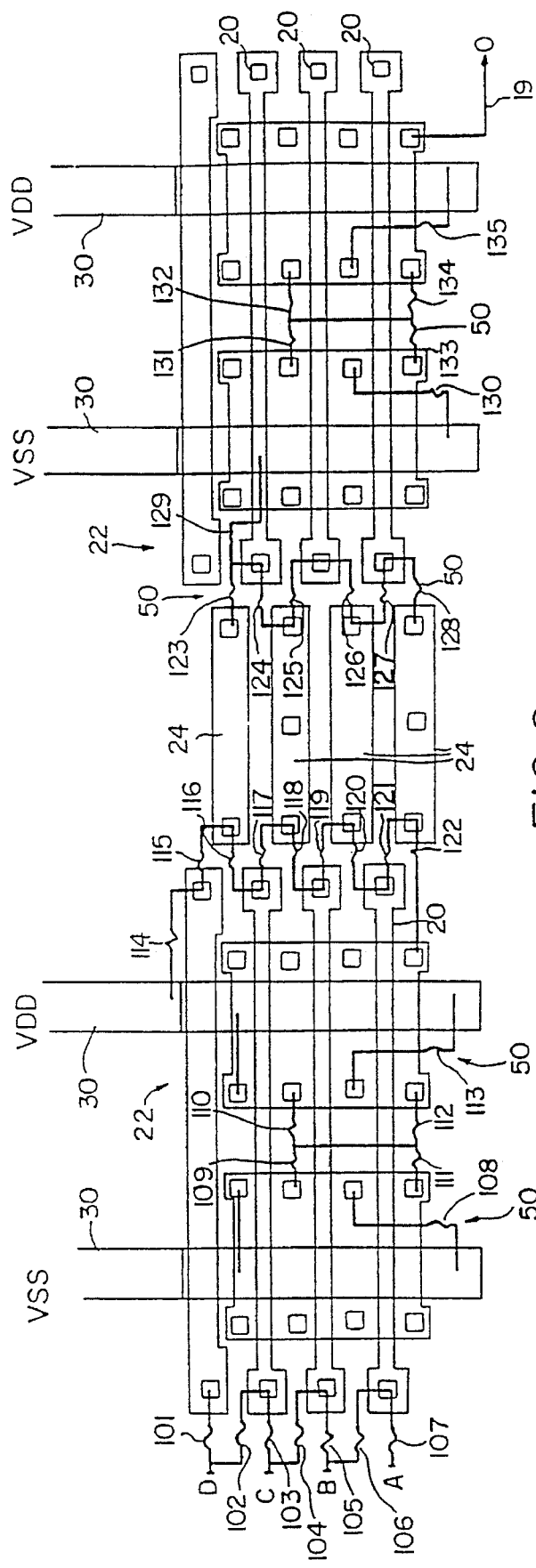
FIG. 2 is a detailed illustration of a portion of a layout shown in FIG. 1, illustrating fusible interconnections between individual semiconductor elements and between functional groups of areas defining gates.

FIG. 2 illustrates a portion of the gate array of FIG. 1 onto which interconnections have been made in accordance with the present invention. The interconnections are made by and between the metal interconnections layers formed, normally, as the layers before the last layer during the fabrication of the integrated circuit.

Turning to FIG. 2, and adopting the reference numerals already used in connection with FIG. 1, it is seen that gates 20 and groups 22 of gates 20 are interconnected directly or through underpasses 24, by means of a multiplicity of fusible links 50. Fusible links 50 also interconnect gates 20 with power lines 30. According to a preferred embodiment of the present invention, the fusible links 50 provide a plurality of alternative interconnections between the various gates and power lines, such that until some of the fusible links are fused, the gate array is not practically useful.

It is emphasized that the invention is not limited to any particular pattern of fusible link interconnections between conductors.

Further in accordance with a preferred embodiment of the present invention, the fusible links are not arranged such that they can be fused by means of providing electrical current through the external connections of the integrated circuit. No such electrical connections are provided for that purpose. Thus fusible links 50 are adapted for fusing by application of energy locally to the links themselves or to the vicinity thereof. Obviating the need for electrical connections for fusing greatly simplifies the design and increases the circuit carrying capacity of integrated circuits.

The fusible links 50 illustrated in FIG. 2 have a number of different functions. They may serve as "substructure" links which join semiconductor elements so as to define functions of individual logic gates. Alternatively or additionally they may serve as "interconnection" links, which serve to join individual cells in a predetermined order to provide a desired multiple cell function. This is known as "routing" due to the necessity to rout the interconnections properly to avoid undesired short circuits. FIG. 2 shows a circuit having inputs A,B,C, and D and an output 0.

The effect of fusing selected fusible links will now be considered with reference to FIGS. 3A–3C and 4A–4C. To aid in this consideration, the individual fusible links illustrated in FIG. 2 will be identified by numbers beginning with 101.

Figure 3A:
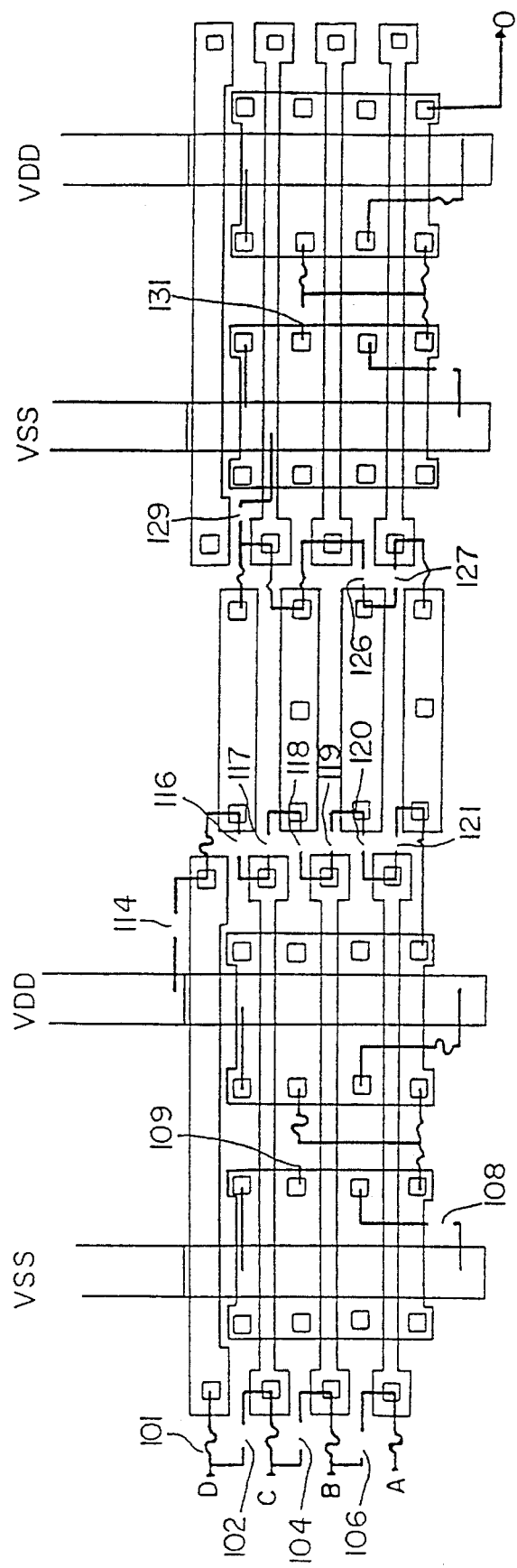
FIGS. 3A, 3B and 3C are illustrations of the part of the integrated circuit shown in FIG. 2, wherein selected ones of the fusible interconnections have been fused, in three different configurations.

In FIG. 3A, the following links are fused: 102, 104, 106, 108, 109, 114, 116, 117, 118, 119, 120, 121, 126, 127, 129 and 131. The remaining links remain intact.

Figure 4A:
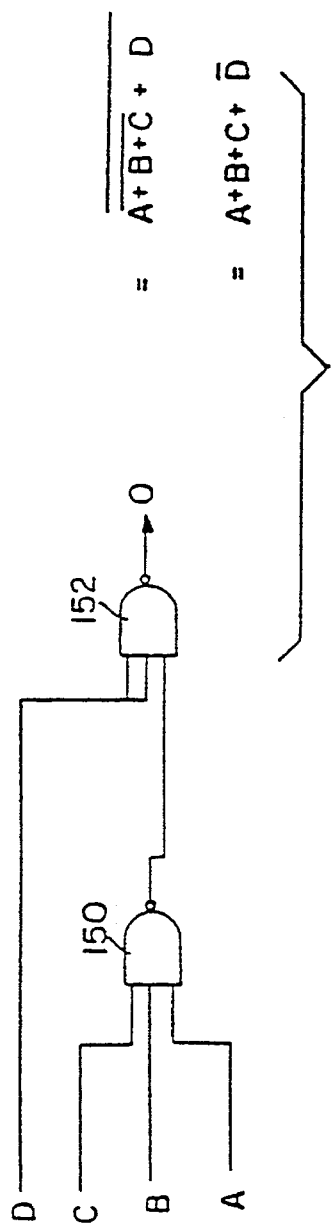
FIGS. 4A, 4B and 4C are illustrations of the electrical equivalent circuits to the circuits of FIGS. 3A, 3B and 3C respectively.

FIG. 4A illustrates the resulting equivalent logic circuit which includes a NAND gate 150 operating on inputs A, B and C and a second NAND gate 152 operating on the output from NAND gate 150 as well as input D. The output 0 from NAND gate 152 is the logic function: A B C+D.

Figure 3B:
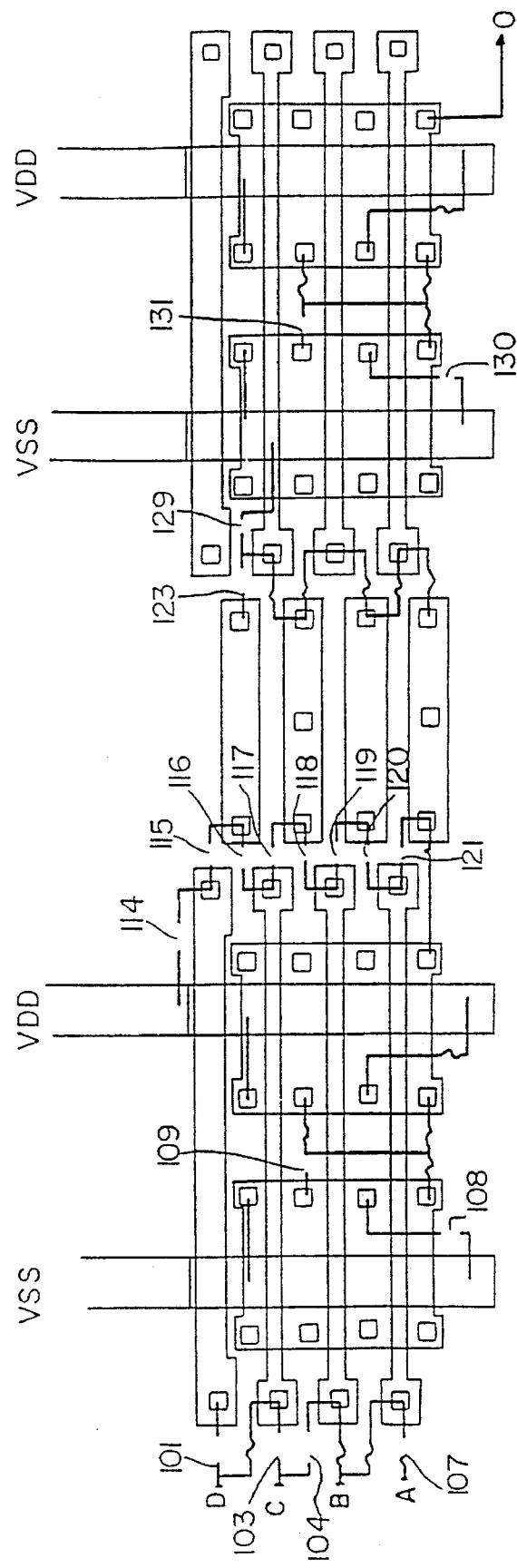

In FIG. 3B, the following links are fused: 101, 103, 104, 107, 108, 109, 114, 115, 116, 117, 118, 119, 120, 121, 123, 129, 130 and 131. The remaining links remain intact.

Figure 4B:
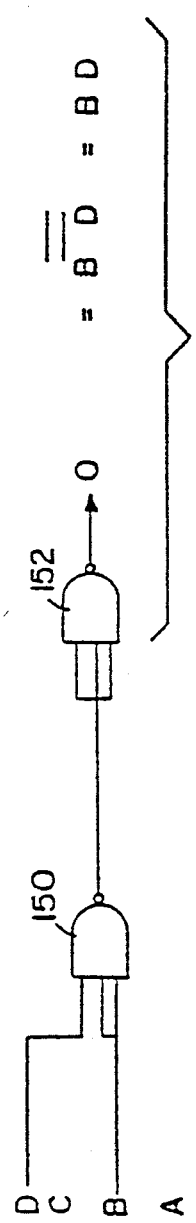

FIG. 4B illustrates the resulting equivalent logic circuit which includes a NAND gate 150 operating on inputs B and D and a second NAND gate 152 operating on the output from NAND gate 150. The output 0 from NAND gate 152 is the logic function: B D.

Figure 3C:
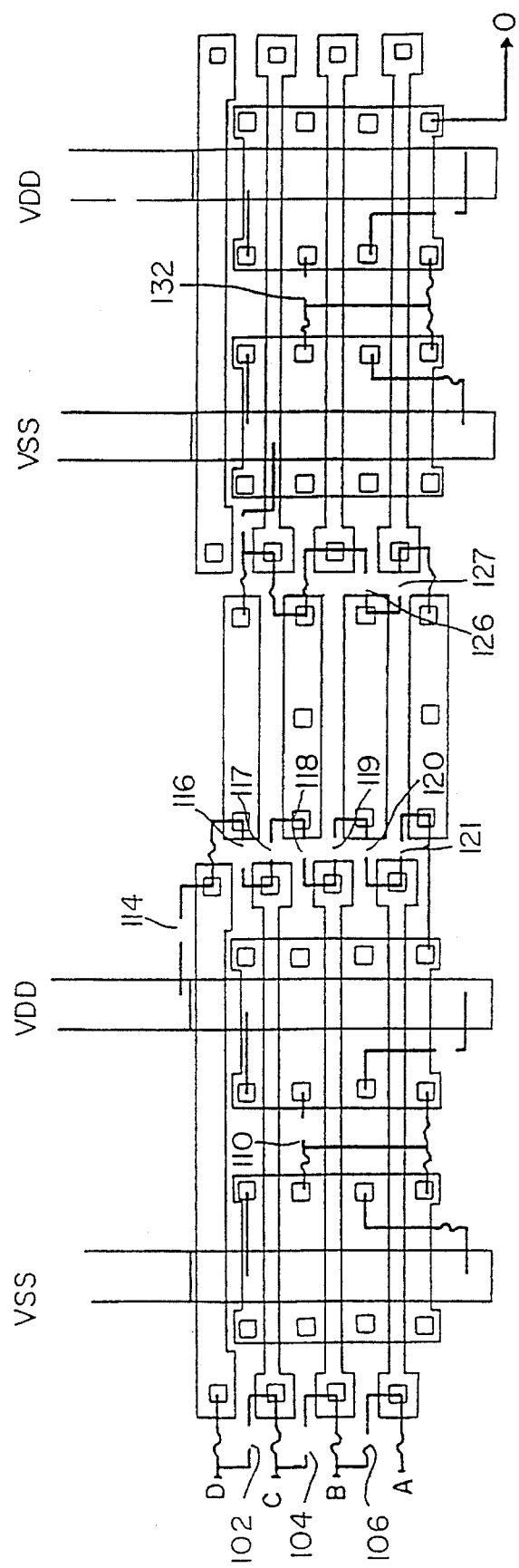

In FIG. 3C, the following links are fused: 102, 104, 106, 110, 114, 116, 117, 118, 119, 120, 121, 126, 127 and 132. The remaining links remain intact.

Figure 4C:
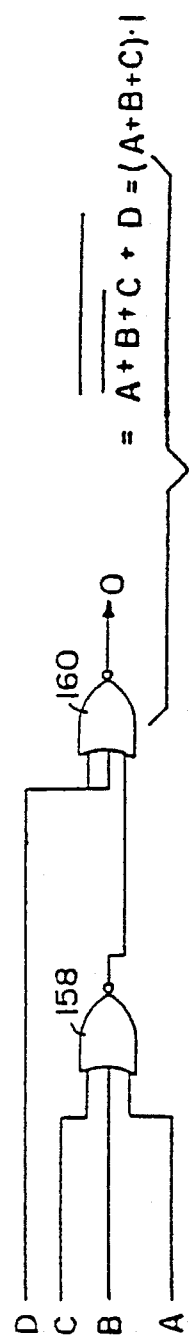

FIG. 4C illustrates the resulting equivalent logic circuit which includes a NOR gate 158 operating on inputs A, B and C and a second NOR gate 160 operating on the output from NOR gate 158 and input D. The output 0 from NOR gate 160 is the logic function: $(A+B+C)\overline{D}$.

From the above examples it may be appreciated that the following fusible links may be considered as "substructure links": 108, 109, 110, 111, 112, 113, 130, 131, 132, 133 and 134.

Likewise, the following fusible links may be considered as "interconnection" links: 101, 102, 103, 104, 105, 106, 107, 114, 115, 116, 117, 118, 119, 120, 121, 122, 123, 124, 125, 126, 127, 128, and 129.

It is possible, of course, for fusible links to have both functions.

The process of integrated circuit fabrication in accordance with the present invention is summarized as follows: The steps include providing a conventional gate array or any other integrated circuit without an interconnection layer and providing interconnections between the various elements in the gate array including multiple fusible connections, as shown hereinbelow with reference to FIGS. 5 and 6. Alternatively, they can be carried out by the manufacturer of the integrated circuit in accordance with the present invention.

The integrated circuit is then supplied to the customer, such as a manufacturer of electronic equipment. In the form supplied, the integrated circuit is normally not usable for any usual commercial function.

The customer then fuses selected fusible links on the individual integrated circuits to define a particular desired electronic function. According to an embodiment of the invention with reference to FIG. 7, the fusing step is carried out by operation directly on the fusible link by a source of fusing energy, such as laser energy. According to an alternative embodiment of the invention with reference to FIGS. 9A–9D, the fusing step carried out using etching techniques. Once the appropriate links have been fused, as aforesaid, and the integrated circuit has been tested appropriately, it is ready for incorporation into an electronic system.

Figure 5:
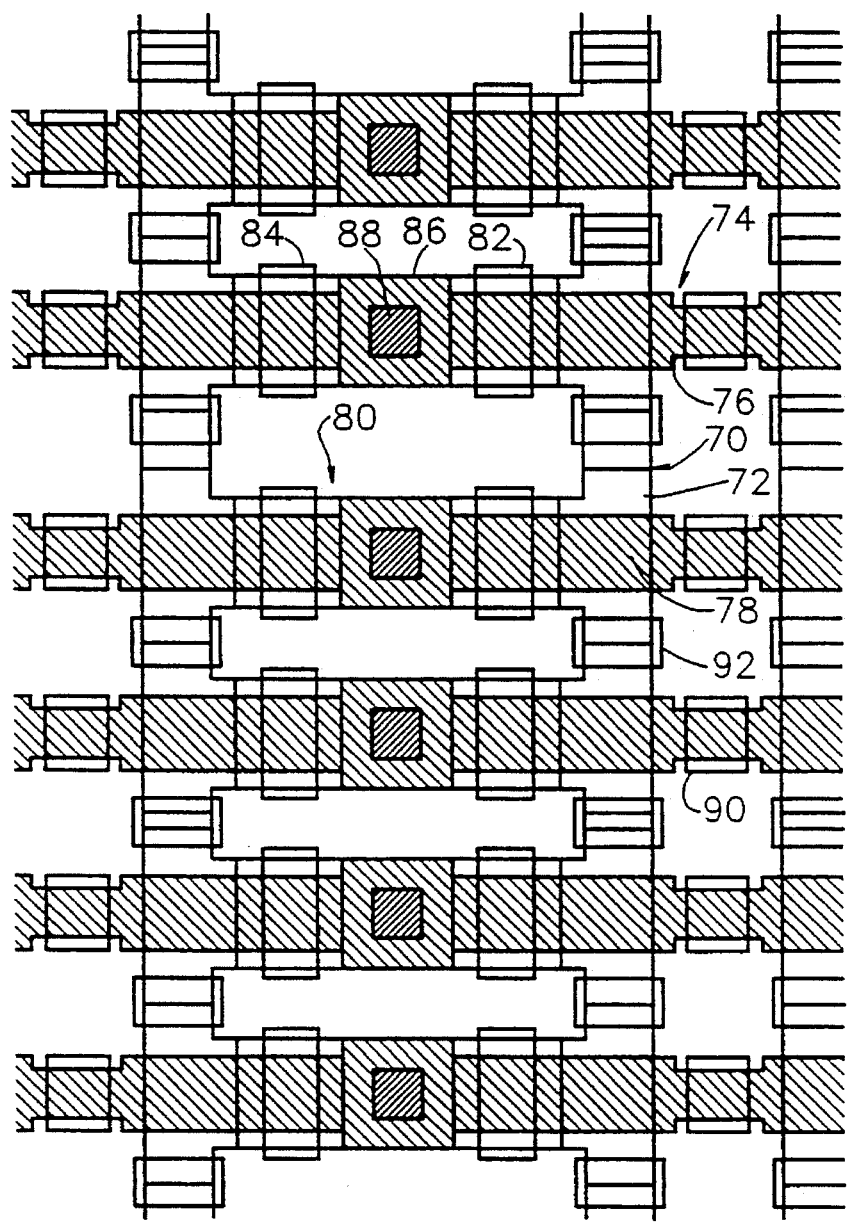
FIG. 5 is an enlarged illustration of a metal on metal structure of a gate array according to still another preferred embodiment of the invention.
Figure 5:
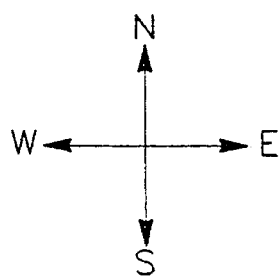

Reference is now made to FIG. 5, which illustrates a metal on metal routing structure of a device constructed and operative in accordance with the present invention. The structure of FIG. 5 is similar to that shown in FIG. 10B but provides sharing of vias by two adjacent strips. This arrangement has been found to be highly effective in providing enhanced compactness. For convenience in description, directions East, West, North and South are defined on FIGS. 5 and 6. These designations have no other significance and do not indicate any preferred orientation of the device or of the metal structure thereof.

A first metal layer 74, typically metal I, is disposed in the plane of the paper and comprises a plurality of parallel elongate strips 76, extending East-West. A second metal layer 70, typically metal II, is disposed in a plane generally parallel to the plane of the first metal layer and is electrically insulated therefrom. The second metal layer comprises a plurality of parallel elongate strips 72, extending North-South.

It is noted that the regions at which the strips 72 and 76 overlie in electrically insulative relationship are here termed elongate strip overlap locations and are indicated by reference numerals 78.

Interconnecting adjacent pairs of elongate strips 72 are a plurality of branch strips 80. The branch strips 80 are straight and extend in overlapping relationship with strips 76. Formed on each of branch strips 80 are a pair of fusible links 82 and 84. Intermediate the fusible links 82 and 84 is a branch overlap location indicated by reference numeral 86. It is noted that branch overlap locations 86 are not found at elongate strip overlap locations 78.

At each branch overlap location 86 there is defined a via 88, providing electrical communication between the branch 80 and the elongate strip 76.

Additionally fusible links, here labelled 90, are provided along strip 76 between adjacent pairs of strips 72. Fusible links 92 are provided along strips 72 between adjacent strips 76.

The structure of FIG. 5 is highly compact but requires the ability to fuse a metal II fuse without disturbing an underlying metal I strip.

Figure 6:
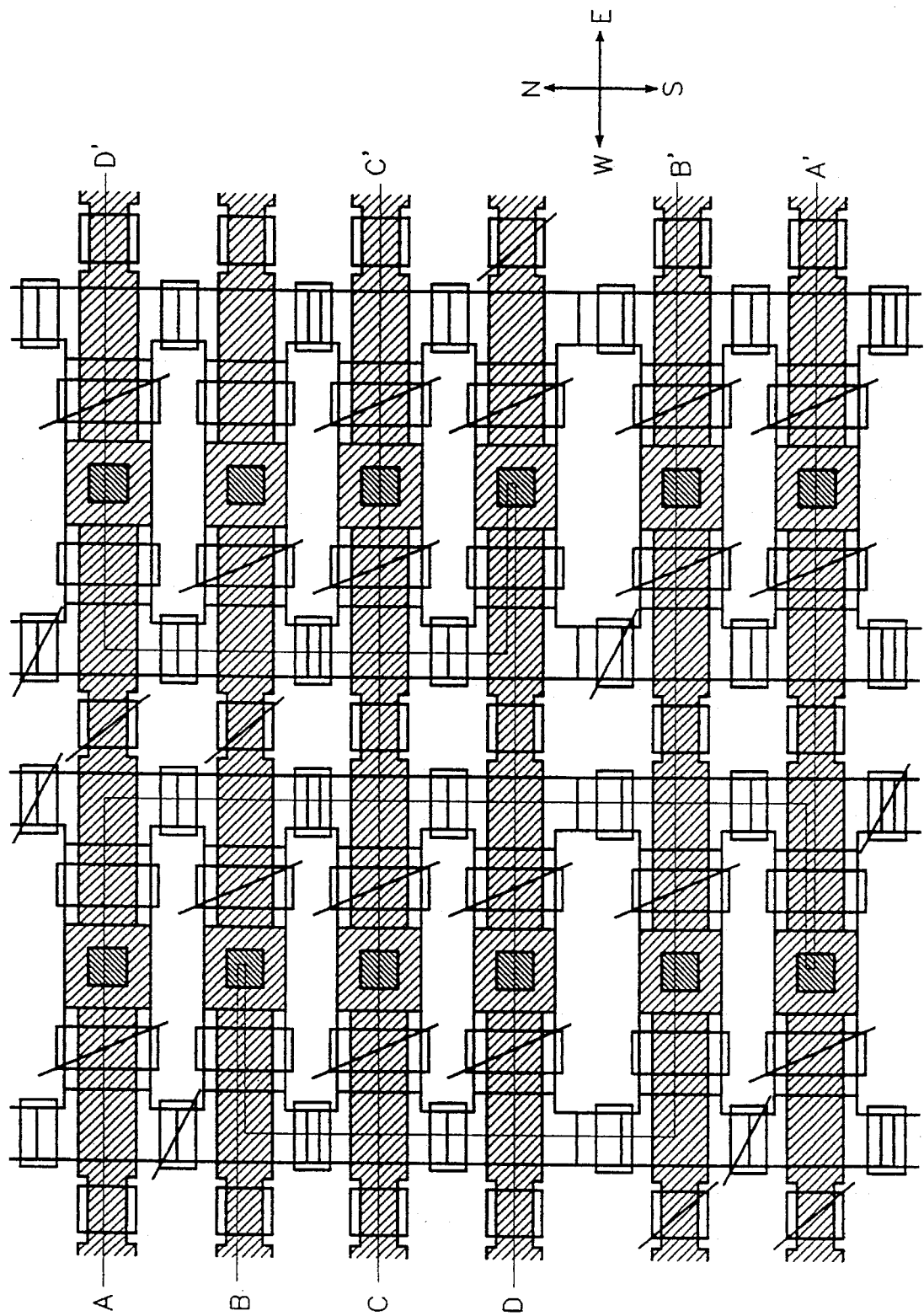
FIG. 6 is an enlarged illustration of the structure of FIG. 5 configured to define the layout of FIG. 10A.
Figure 10A:
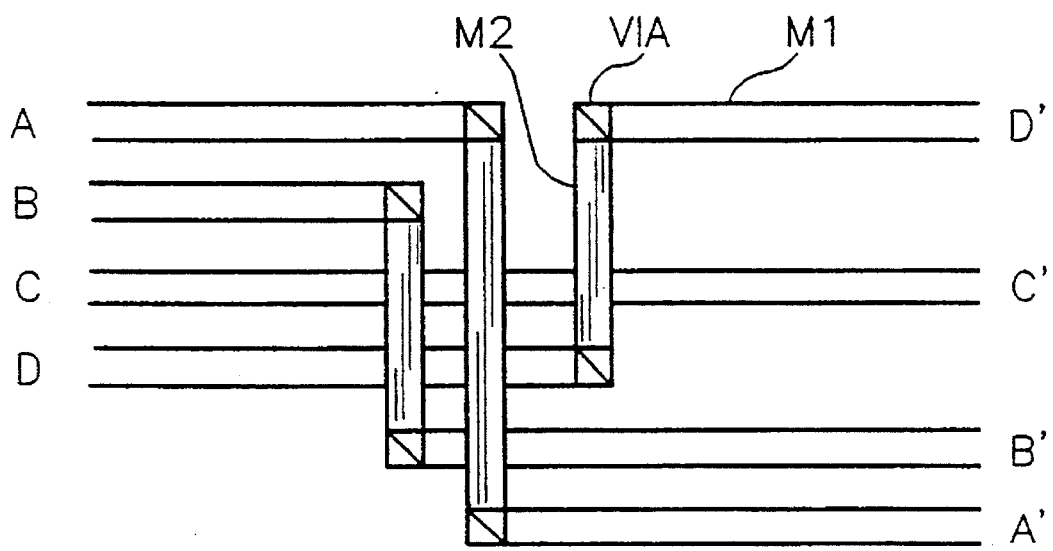
Figure 10A:
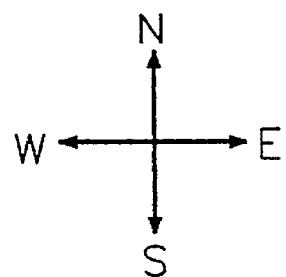

Reference is now made to FIG. 6, which illustrates the structure of FIG. 5 which has been customized to correspond to the circuit layout of FIG. 10A. Fuses which have been fused are shown with a superimposed /.

Reference is made to the following copending patents and applications of the Applicant: U.S. patent application Ser. No. 819,707, filed 17 Jan. 1986 and issued May 8, 1990 as U.S. Pat. No. 4,924,287; U.S. patent application Ser. No. 117,943, filed 6 Nov. 1987; U.S. patent application Ser. No. 172,235, filed 23 Mar. 1988 and issued 24 Oct. 1989 as U.S. Pat. No. 4,875,971; U.S. patent application Ser. No. 117,580, filed 6 Nov. 1987; U.S. patent application Ser. No. 222,514 filed 21 Jul. 1988 and issued 12 Jun. 1990 as U.S. Pat. No. 4,933,738; and U.S. patent application Ser. No. 344,582 (now U.S. Pat. No. 5,049,969), a continuation of U.S. patent application Ser. No. 222,514 (now U.S. Pat. No. 4,933,738), filed 28 Apr. 1989. The disclosures thereof, which are incorporated herein by reference, pertain to apparatus and techniques, particularly with respect to fusing, which may be useful in putting the present invention into practice.

It will be appreciated that the layers referred to hereinabove as metal I and metal II layers need not, in fact, be made specifically of metal, but rather may be formed from any suitable electrically conducting material.

Figure 7:
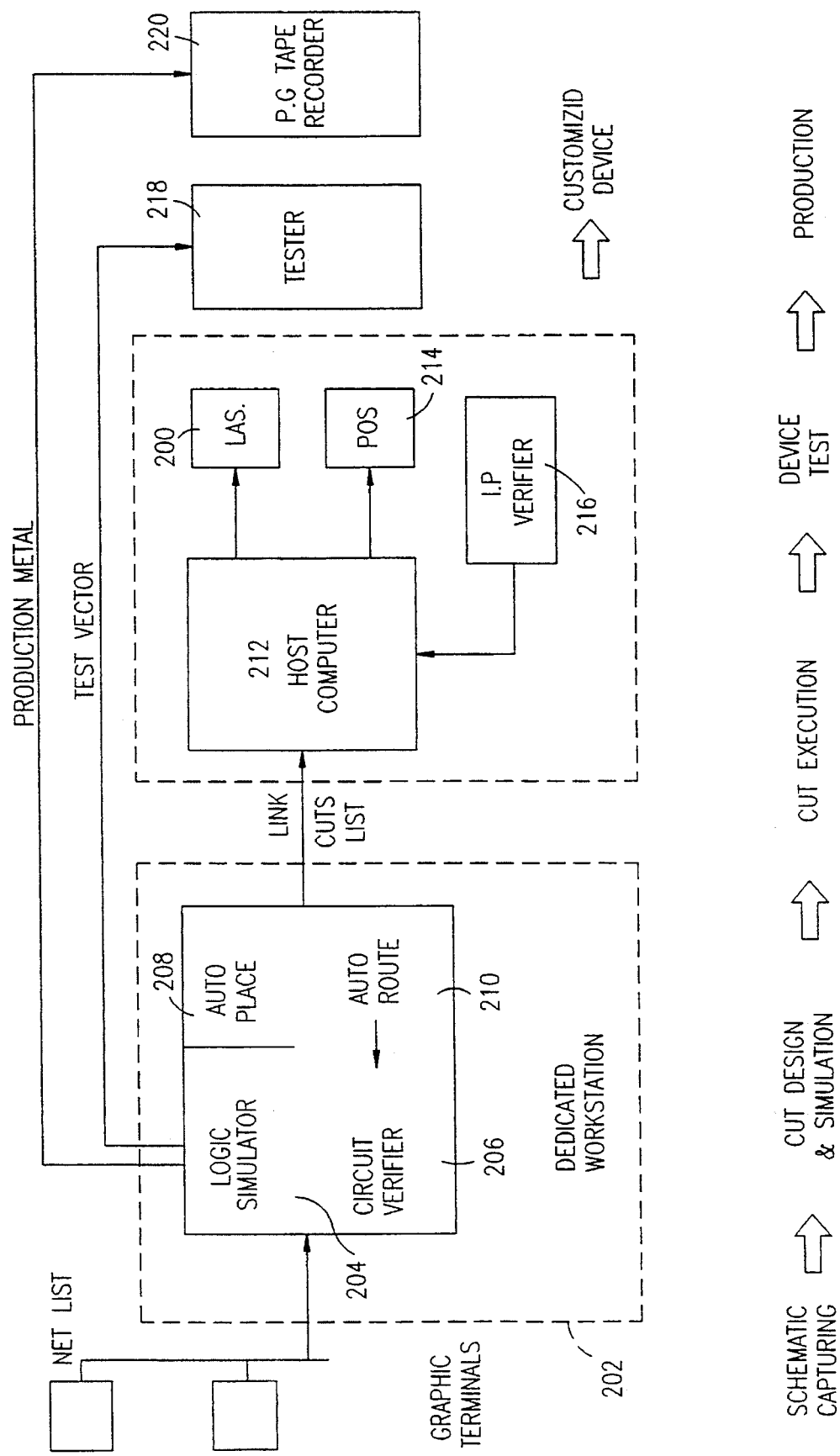
FIG. 7 is a block diagram illustration of apparatus for use in customizing integrated circuits.

Reference is now made to FIG. 7 which illustrates, in block diagram form, apparatus for fusing fusible links 90 utilizing laser energy. The apparatus is based on a conventional laser cutter 200 such as that manufactured by Florod Corporation of Hawthorne, Calif., U.S.A..

A dedicated workstation 202 is preferably but not necessarily provided for input of desired design and operation data and may include logic simulator apparatus 204, circuit verification apparatus 206, as well as automatic placement and routing apparatus 208 and 210 respectively for determining the cutting pattern design.

The workstation 202 communicates with various input and output elements, such as a graphics terminal and tape or disk storage apparatus, not shown and also communicates with a host computer 212, such as a PDP-11/23. The host computer receives the cutting pattern design from the workstation and provides control commands to the laser cutter 200 and positioning apparatus 214. A position verifier circuit 216 provides confirmation of correct positioning and cutting. Additional testing and cut program recording apparatus 218 and 220 is also provided. The information recorded in apparatus 220 may be used for direct mass production of integrated circuits including a metal layer having the desired interconnection links.

It will be appreciated by persons skilled in the art that the invention can be carried out using the conventional Florod laser cutter or equivalent available apparatus together with conventional available computer technology without the special purpose apparatus described in FIG. 7.

Figure 8:
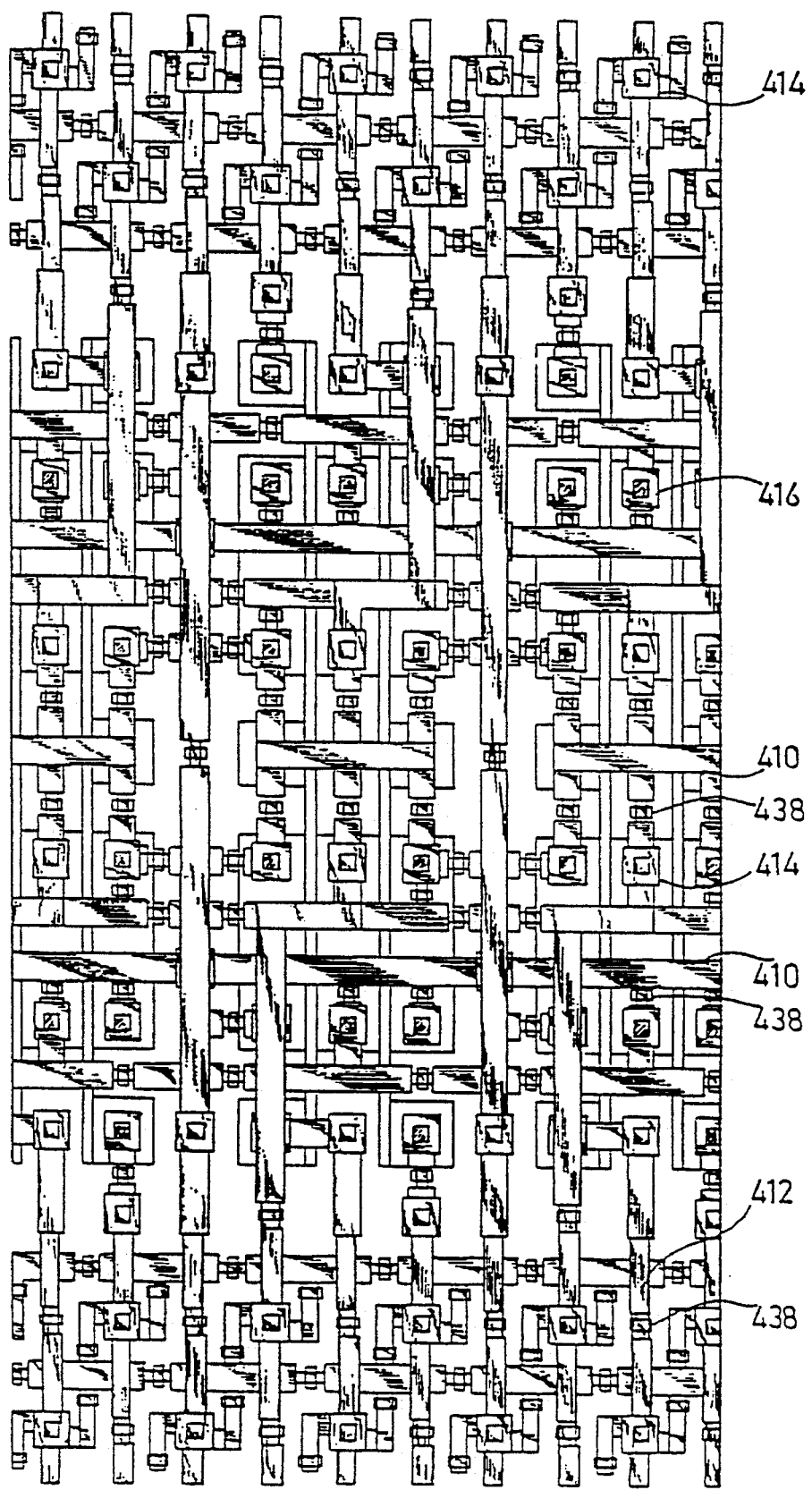
FIG. 8 is a pictorial overlay illustrating the layout of a portion of a customizable array useful in an embodiment of the present invention.
Figure 9A:
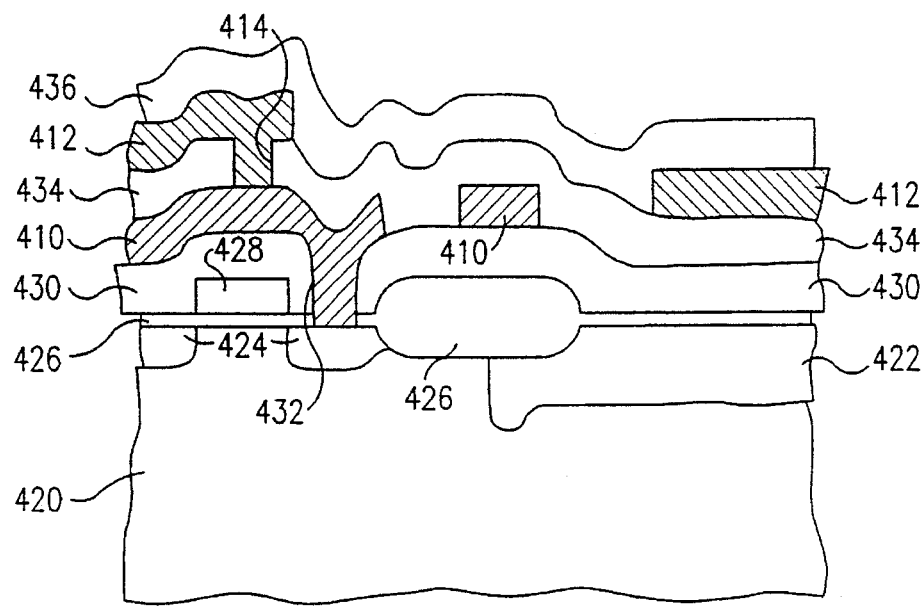
FIGS. 9A–9D are illustrative sectional views representing the various stages of a technique provided in accordance with one embodiment of the present invention.
Figure 9B:
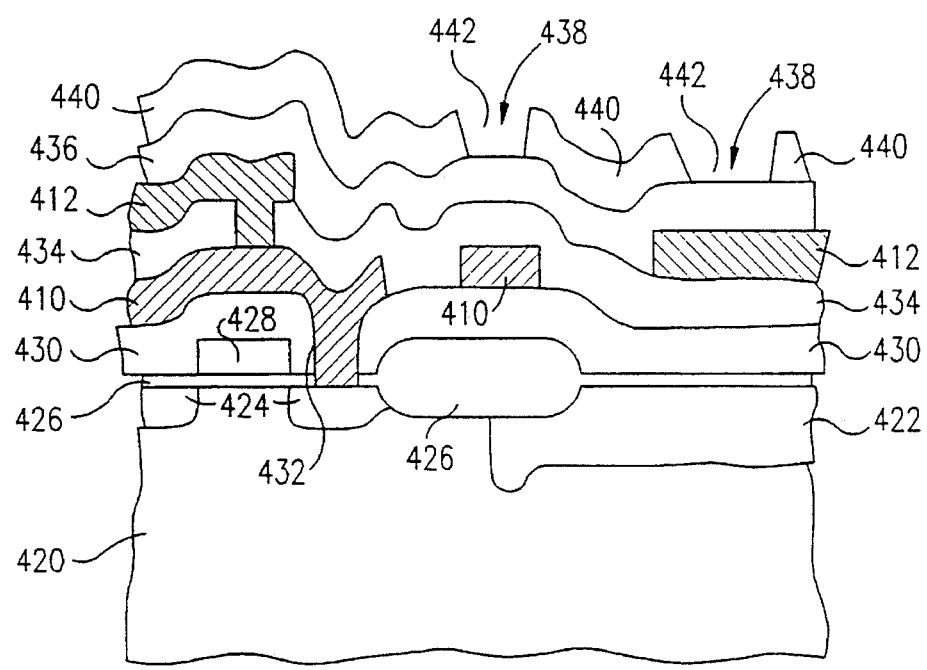
Figure 9C:
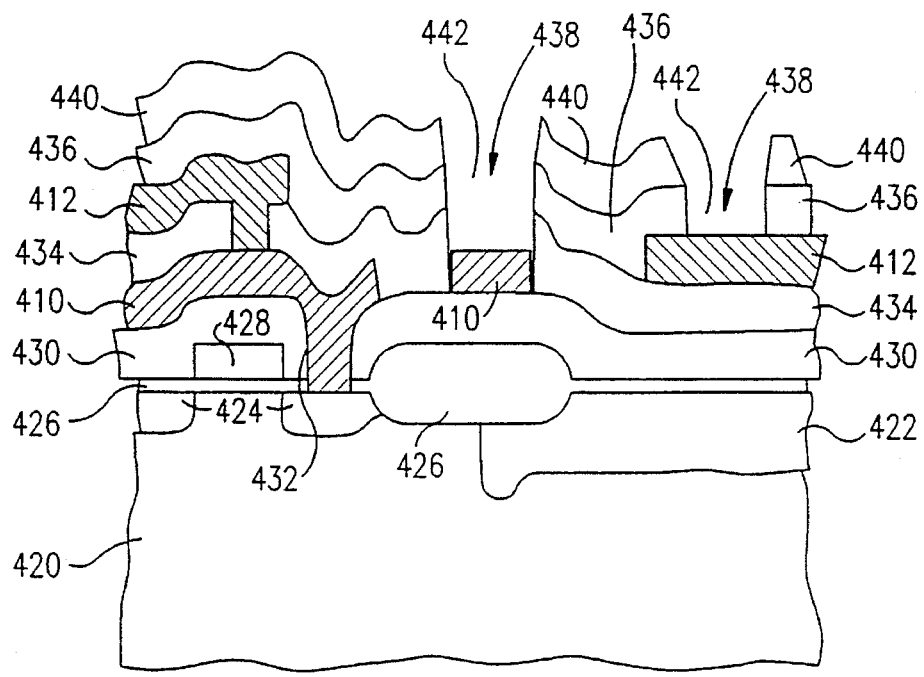
Figure 9D:
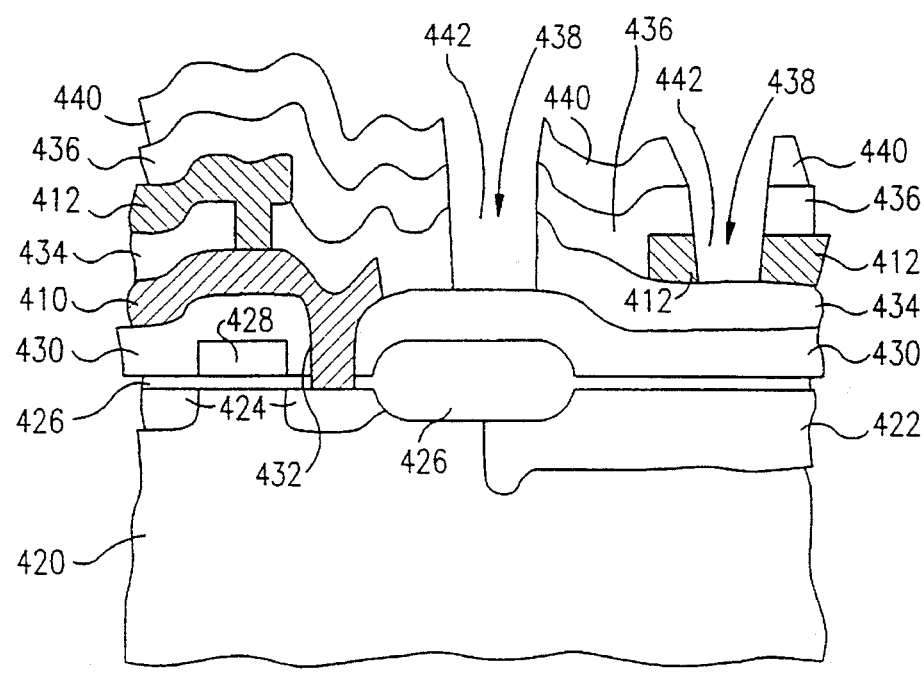

Reference is now made to FIGS. 8–9D, which illustrate a technique for manufacture of a customized integrated circuit in accordance with a preferred embodiment of the present invention.

Specifically considering FIG. 8, a portion of a customizable integrated circuit blank is seen wherein strips of a metal I layer 410 and of a metal II layer 412 are generally arranged in mutually perpendicular orientation so as to define a grid. Vias interconnecting the metal I and metal II layers are indicated at reference numeral 414 and contacts for the connection of semiconductor elements, such as transistors, are indicated at reference numeral 416.

The metal I and metal II layers 410 and 412 are separated by insulative material, not shown, which prevents electrical contact therebetween, except at vias 414.

The arrangement of the various layers may be additionally appreciated from a consideration of FIG. 9A, which illustrates in section a portion of an integrated circuit blank. The blank includes a substrate 420 onto which is formed semiconductor material layers 422, 424, 426 and 428. A contact layer 430 is formed thereover, typically comprised of an insulative material, such as $SiO_2$, and with contact holes 432 formed therein to allow contacts to be made between the semiconductor elements 424 and 428 and metal 410 formed thereover.

A metal I layer 410 is formed over the contact layer and defines a contact 432 in electrical contact with semiconductor material 424. A via layer 434 is shown disposed over metal I layer 410, and metal II layer 412 is shown disposed over via layer 434 and extending therethrough at vias 414 into electrical contact with the metal I layer 410. A passivation layer 436 is formed over the metal II layer 412 and the via layer 434, where exposed.

It is a particular feature of the present invention that the various layers are configured such that the metal I and metal II layers are always exposed for etching at locations where removal thereof may be desired thereby to produce fusing. This is seen from a consideration of FIG. 8 which shows a multiplicity of fusible links, or potential removal regions, 438 wherein those fusible links for the metal I layer are not covered with the metal II layer.

The technique of the present invention will now be described with particular reference to FIGS. 9A–9D. The configuration illustrated in FIG. 9A and described hereinabove is chararacteristic of a integrated circuit blank which is ready for single mask specific configuration in accordance with a preferred embodiment of the invention.

In accordance with the present invention, as illustrated in FIG. 9B, a photoresist layer 440 is deposited over the passivation layer 436. Then, in accordance with a preferred embodiment of the present invention, an application-specific mask may be used to expose the photoresist layer 440 and to define openings 442 in the photoresist layer. This application-specific mask defines openings 442 at desired regions selected from the potential fusible links 438 which are called for by the given application.

Following exposure of the photoresist layer, the photoresist overlying the selected fusible links 438 is removed, thereby defining the openings 442. The passivation layer 436 and the via layer 434, where present, are removed, as by etching at the regions defined by openings 442. The result of such removal is illustrated in FIG. 9C.

The metal layers, which typically include both metal I and metal II layers, are then removed at the regions underlying openings 442, as by etching. The result of this removal is illustrated in FIG. 9D and provides an application specific integrated circuit in accordance with the present invention.

If desired, an additional passivation layer may be added over the integrated circuit.

According to an alternative embodiment of the present invention, a generalized mask, may initially be used to expose photoresist layer 440 at all of the potential fusible links 438. Thereafter the photoresist at the exposed region is removed and the passivation layer 436 and the via layer 434, where present, are etched at all of the exposed potential fusible links 438. The etched wafers are then covered once again with photoresist. Only thereafter is a single application-specific mask used to define those potential fusible links 438 at which metal II and/or metal I is to be removed.

One advantage of this alternative technique, particularly when a precisely formed general mask is employed, is that the subsequently used single mask need not be as precise in its pattern definitions of the region to be removed, since the configuration of all of the potential fusible links has already been precisely defined by the general mask. As a further alternative, the general mask may in fact be comprised of a plurality of general masks, each specifically configured for a given metal layer, which masks are sequentially exposed.

It is a particular feature of the present invention that openings 442 define windows which relate to a particular predetermined customized configuration of a mass-produced, relatively general purpose integrated circuit blank. It is also a particular feature of the present invention that a plurality of metal layers are etched simultaneously.

In accordance with a preferred embodiment of the present invention the mask may be produced by laser radiation of chrome or any other suitable material. According to one embodiment of the invention, the application-specific single mask may be generated from the general mask by blocking the regions corresponding to non-selected potential fusible links 438.

It will be appreciated by persons skilled in the art that the present invention is not limited by what has been particularly shown and described above and is defined only by the claims which follow:

We claim:

1. A device having a plurality of accessible input/output pins comprising:

a substrate;

a plurality of transistors provided on said substrate; and a plurality of links connecting the transistors into an inoperable circuit, at least some of said plurality of links having designated fuse locations, said plurality of links and transistors being arranged such that, upon disconnecting of selected ones of said plurality of links at ones of said designated fuse locations, said plurality of links and transistors is interconnected into an operable CMOS gate array circuit, wherein said fuse locations are not selectively fusible by current supplied at said accessible input/output pins of the device.

2. A device according to claim 1, wherein said links with said fusible locations are formed in a plurality of metal layers, adjacent metal layers being separated by an insulation layer.

\* \* \* \* \*